United States Patent [19]

Ewers

[11] Patent Number: 5,315,241

[45] Date of Patent: May 24, 1994

[54] METHOD FOR TESTING INTEGRATED CIRCUITS

[75] Inventor: Charles R. Ewers, Phoenix, Ariz.

[73] Assignee: SGS-Thomson Microelectronics, Inc., Carrollton, Tex.

[21] Appl. No.: 761,728

[22] Filed: Sep. 18, 1991

[51] Int. Cl.$^5$ .............................................. G01R 31/28
[52] U.S. Cl. ................................ 324/158 R; 324/73.1; 437/8
[58] Field of Search .................. 324/73.1, 158 R, 537; 357/45; 437/8; 257/48; 29/574

[56] References Cited

U.S. PATENT DOCUMENTS

| | | | |
|---|---|---|---|
| 4,038,648 | 7/1977 | Chesley | 324/73.1 |
| 4,289,449 | 8/1981 | Ports et al. | 324/537 |
| 4,467,400 | 8/1984 | Stopper | 357/45 |
| 4,956,602 | 9/1990 | Parrish | 324/158 R |
| 4,961,053 | 10/1990 | Krug | 324/73.1 |
| 5,008,614 | 4/1991 | Shreeve et al. | 324/158 F |
| 5,012,187 | 4/1991 | Littlebury | 324/158 F |
| 5,038,101 | 8/1991 | Murphy | 324/158 F |
| 5,121,053 | 6/1992 | Shreeve et al. | 324/158 F |
| 5,126,657 | 6/1992 | Nelson | 324/158 F |

FOREIGN PATENT DOCUMENTS 8802549  4/1988  World Int. Prop. O. .

Primary Examiner—Vinh Nguyen
Attorney, Agent, or Firm—Kenneth C. Hill; Robert Groover; Richard K. Robinson

[57] ABSTRACT

A substrate is provided as a test fixture for burning-in and testing integrated circuit devices. The substrate contains a plurality of unpackaged integrated circuit dice arranged in a regular matrix of rows and columns. The substrate is partitioned into an array of rectangles which can be easily broken apart. One integrated circuit die is attached in each rectangle. The integrated circuits are bonded to conductive traces in their respective rectangular areas, and the conductive traces are connected to common locations at one side of the substrate. Voltages can be applied to all of the devices simultaneously by contacting the common locations at the edge of the substrate. This allows for burn-in of all integrated circuit devices on the substrate in parallel, after which they can be separated and used individually on printed circuit boards.

20 Claims, 3 Drawing Sheets

METHOD FOR TESTING INTEGRATED CIRCUITS

BACKGROUND OF THE INVENTION

1. Field of the Invention

The present invention relates generally to electronic devices, and more specifically to fabrication of system subassemblies such as memory boards and memory modules.

2. Description of the Prior Art

Assembly and test of computer subsystems, such as memory modules and subsystems, can add a significant percentage to the cost of completed computers. It is important to complete the assembly and testing of subassemblies in a cost efficient manner in order to keep production prices for the subassemblies low enough for them to be sold at competitive prices.

With some systems, the integrated circuit devices which are used are not guaranteed to have a 100% incoming functionality. For example, it has been proposed to provide personal computer memory subsystems which are designed to use memory chips which are partially nonfunctional, and use error detection and correction circuitry to compensate for chip defects. An example of such a proposed subsystem is described in detail in co-pending patent application Ser. No. 07/722,937 titled MEMORY SUBSYSTEM.

It is known that integrated circuits generally tend to have a high percentage of failures very early in the lifetime of the devices. This phenomena is often referred to as infant mortality. Since a significant percentage of parts fail in a short period of time, it is common to subject integrated circuit devices to relatively severe operating CONDITIONS for a short period of time in order to force these infant mortality failures to occur. This process is often referred to as burn-in. Proper burn-in tends to be somewhat expensive because of the large number of test fixtures required, but can virtually eliminate failures of integrated circuit devices within the first few years of their operating lifetime. Parts which survive burn-in tend to function for a significant fraction of their expected device lifetime.

In the case of partially nonfunctional devices, such as the memory devices described above, the integrated circuit chips generally have not been subjected to burn-in. These chips were generally rejected at the wafer probe stage. Therefore, a system which makes use of such devices is preferably subjected to burn-in test procedures in order to find and remove devices easily subject to complete failure.

It would be desirable to provide a technique which helps minimize the overall assembly and test time and expense for subsystem assembly and burn-in. Such a system preferably provides a relatively high degree of parallelization during burn-in, and the ability to individually test the integrated circuit devices.

SUMMARY OF THE INVENTION

Therefore, according to the present invention, a substrate is provided as a test fixture for burning-in and testing integrated circuit devices. The substrate contains a plurality of unpackaged integrated circuit dice arranged in a regular matrix of rows and columns. The substrate is partitioned into an array of rectangles which can be easily broken apart. One integrated circuit die is attached in each rectangle. The integrated circuits are bonded to conductive traces in their respective rectangular areas, and the conductive traces are connected to common locations at one side of the substrate. Voltages can be applied to all of the devices simultaneously by contacting the common locations at the edge of the substrate. This allows for burn-in of all integrated circuit devices on the substrate in parallel, after which they can be separated and used individually on printed circuit boards.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
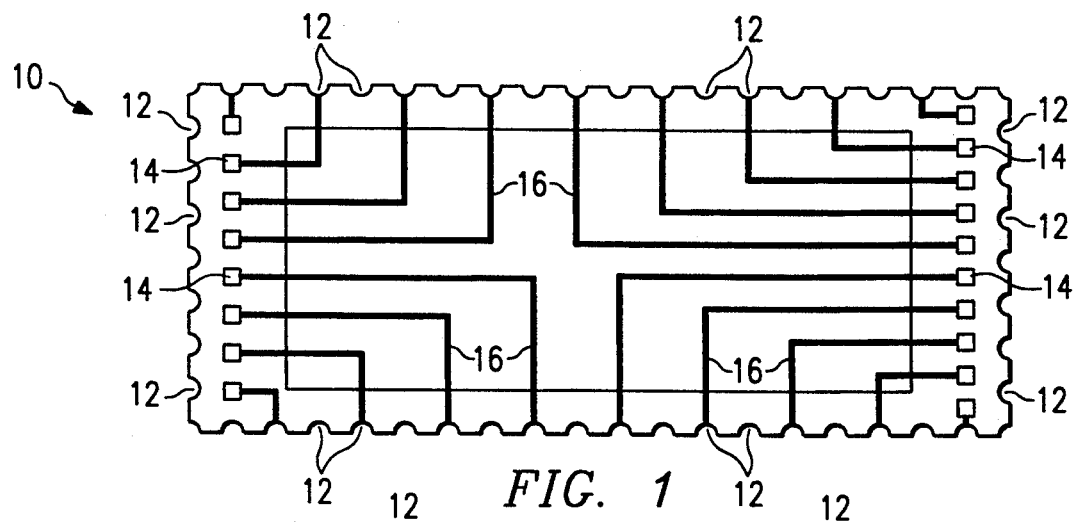
FIG. 1 is a plan view of a single rectangular region of a substrate according to the present invention.

Referring to FIG. 1, reference number 10 refers to a single rectangular region out of a larger test substrate. It is formed of a non-conducting material such as alumina. Rectangular substrate region 10 has been separated from identical adjoining regions by breaking a larger substrate apart along perforations therein. The perforations are preferably round holes, leaving semicircular openings 12 along the edges of the substrate 10.

Bond pads 14 are located at either end of the substrate 10. Conductive traces 16 are formed on the substrate 10, and connect their respective bond pads 14 with one of the semicircular openings 12. The bond pads 14 are conductive pads appropriate for bonding to an unpackaged integrated circuit device. The conductive traces are connected to alternating semicircular openings 12 as shown for reasons which will be described below.

Figure 2:
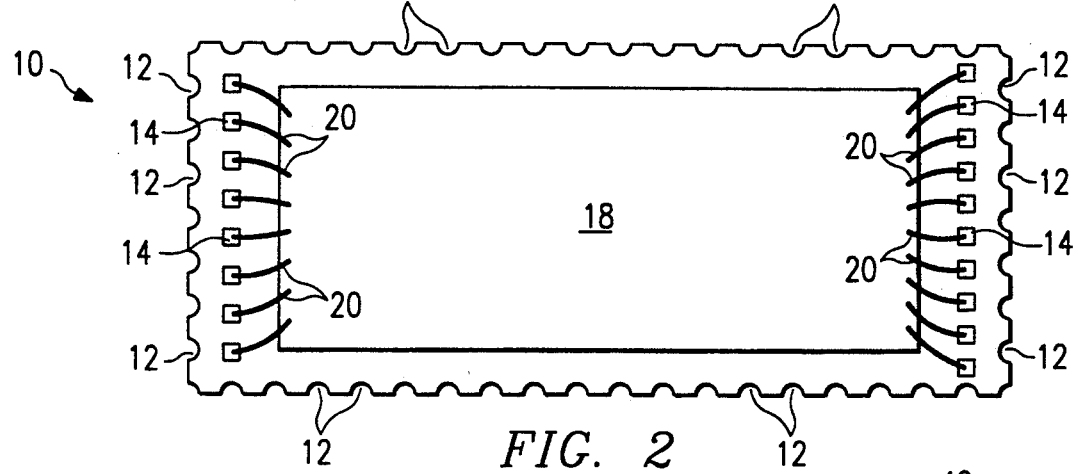
FIG. 2 is a plan view showing an unpackaged integrated circuit die attached to the substrate portion of FIG. 1.

Referring to FIG. 2, the substrate 10 is shown with an integrated circuit device 18 attached thereto. The conductive traces 16 are not shown in FIG. 2. Integrated circuit device 18 Can be, for example, a memory device, and is bonded to the substrate 10 using techniques well known in the art. For example, a non-conductive epoxy resin can be used to bond the device 18 to the alumina substrate 10.

Bonding wires 20 are used to bond the appropriate regions of the integrated circuit device 18 to the bond pads 14. The integrated circuit 18 is preferably bonded to the substrate 10 using thermocompression wedge or thermosonic ball bonding techniques as known in the art. In FIG. 2, the integrated circuit device 18 is shown as having all of the bonding sites on the chip 18 at the two ends. However, different types of devices have different bonding locations. The bond pads 14 are preferably located on the substrate 10 to be conveniently available to the corresponding bond sites on the integrated circuit 18, so as to minimize the length of the bonding wires 20.

Figure 3:
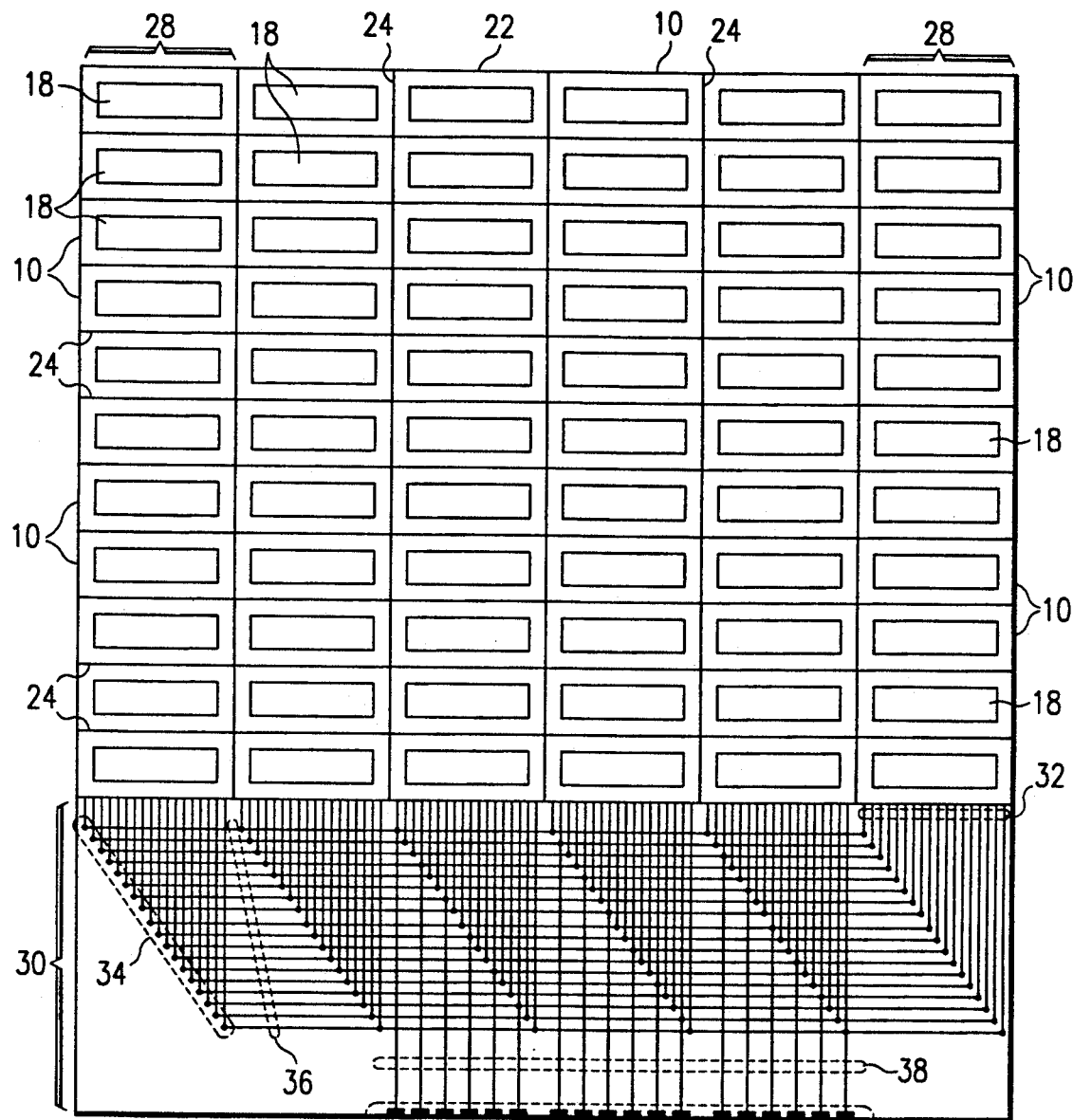
FIG. 3 is a plan view of a substrate according to the present invention.

As shown in FIGS. 1 and 2, the substrate 10 is a rectangular region which has been separated from a larger substrate along perforation lines which were provided therein. Referring to FIG. 3, the complete, original substrate 22 is shown. The substrate 22 is divided into rectangular regions along perforation lines 24. Although shown as simple lines in FIG. 3, perforation lines 24 are preferably rows of holes made completely through the substrate 22. When the rectangular regions are snapped apart along the perforation lines 24, a substrate 10 having scalloped edges as shown in FIGS. 1 and 2 results.

The perforations may be formed by a laser if desired, or by various mechanical means. A substrate, such as substrate 22, which can be .broken into a multiplicity of identical regions can be referred to as a "snap strate".

The semicircular openings 12 of FIG. 1 each correspond to half of a circular opening through substrate 22. When each of the conductive traces 16 connects to its respective opening, the signal trace passes through the opening to the underside of the substrate 22. Connecting a conductive trace on one side of a substrate with conductive traces on the other side of the substrate through plated through-holes is a technique well known in the art.

Figure 6:
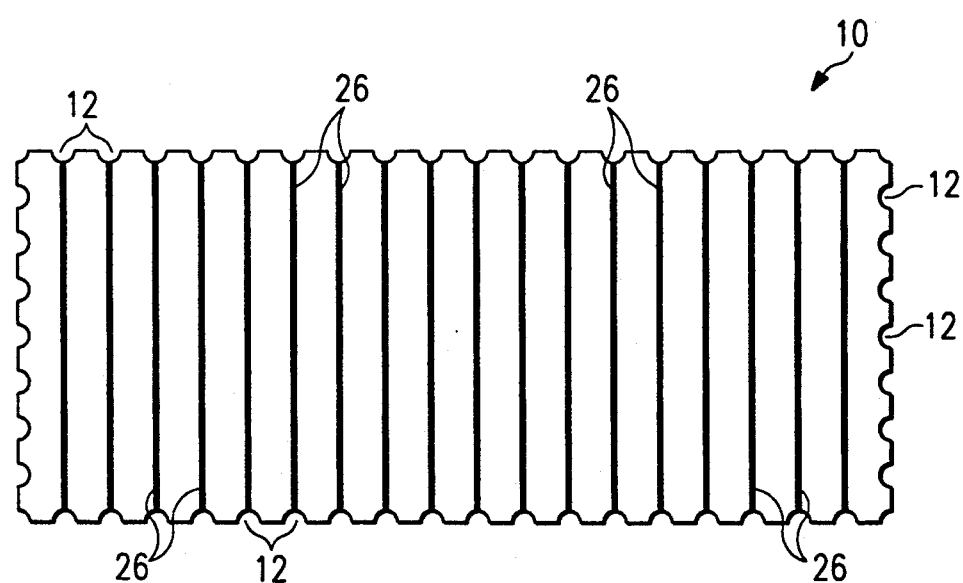
FIG. 6 illustrates conductive traces on the back side of the region of FIGS. 1 & 2.

FIG. 6 illustrates the underside of each substrate region 10. Parallel conductive traces are provided across the width of the substrate 10, and make contact with the openings 12 at either end. Since conductive traces 16 on the upper side of each substrate region 10 make contact with the underside through the openings 12, the underside traces 26 serve to connect all of the integrated circuit devices 18 in each column together. Referring to FIG. 3, six individual columns 28 are provided.

Since the top side traces 16 as shown in FIG. 1 alternate openings 12 to which they are connected, different top side traces 16 are not shorted together by the underside traces 26. On the under side of substrate 22 a parallel bus conductor is formed which has one conductive trace for each bond pad 14 on each substrate region 10.

On one edge of the substrate 22, a substrate edge region is used to connect the underside conductive traces 26 for all of the columns 28 together. For each column 28, underside column traces 32 extend into the substrate edge region 30. The underside column traces 32 terminate at plated through holes 34, which connect through the substrate 22 to top side horizontal traces 36 on the upper surface of the substrate 22. The top side horizontal traces 36 connect corresponding underside column traces 32 together, so that all of the integrated circuit devices 18 are connected in parallel.

Connecting lines 38 contact the topside horizontal traces 36 as shown. Connecting lines 38 are insulated from the top side horizontal traces 36, and connect to connecting pads 40 on the edge of the substrate 22. Each connecting pad 40 corresponds to one power or signal line for all of the integrated circuit devices 18. By connecting the desired signals to the connecting pads 40, all of the integrated circuit devices 18 can be subjected to electrical burn-in simultaneously.

Once burn-in has been completed, the substrate edge region is simply snapped apart from the remaining portions of the substrate 22 along one of the perforation lines 24. Individual probe of the integrated circuit devices 18 can then be performed to test them. The probing is preferably made to the bonding pads 14 rather than to the chip 18. This minimizes damage to the chip 18, and loosens tolerances required for probe. Good and bad devices can be marked in any of several ways known in the art. For example, various die dot patterns can be used to indicate functionality of each of the devices 18.

So that the various integrated circuit devices 18 can be completely isolated during probing, it may be desirable to not connect the ground lines for each device into a common bus underneath the substrate regions 10. Instead, individual traces can be brought to the substrate edge region 30, and connected there. Snapping off the substrate edge region 30 then separates the ground for each of the circuits 18, so that they are isolated electrically during probe testing.

Figure 4:
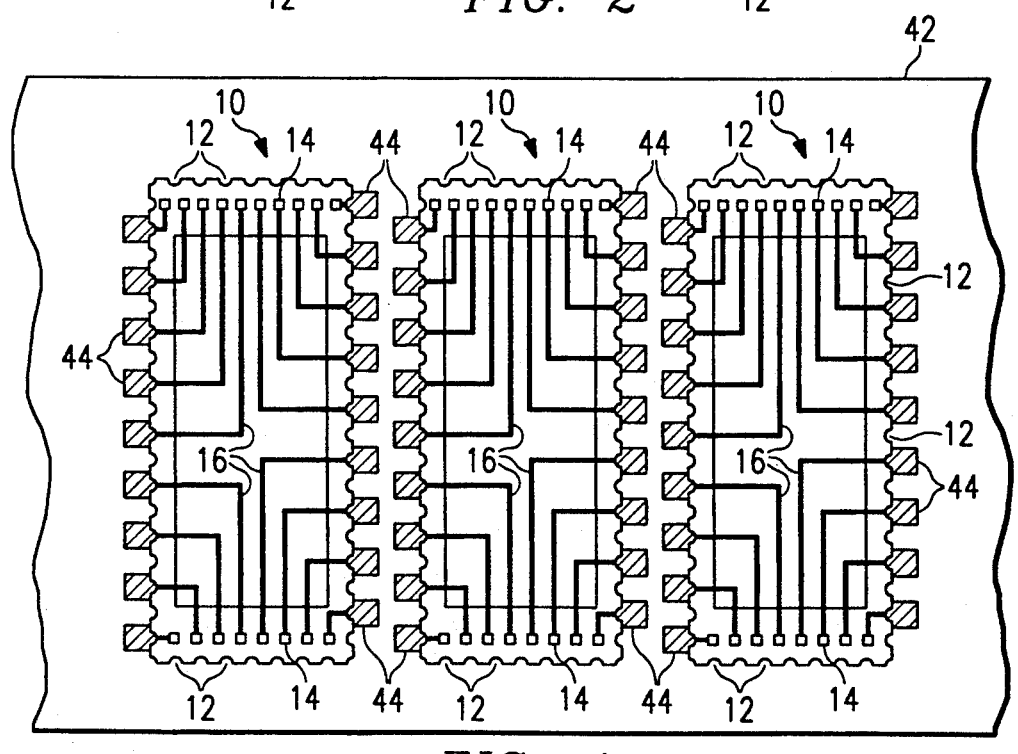
FIG. 4 illustrates several individual rectangular regions removed from the substrate and attached to an underlying printed circuit board.

Once the integrated circuits 18 have been tested, the dice 18 are coated with epoxy or similar material and the substrate 22 is snapped apart long the perforation lines 24, resulting in a multiplicity of devices attached to the substrate regions 10. The devices which meet the test parameters including their substrate regions 10, are then attached to a primary substrate 42, a portion of which is shown in FIG. 4. The primary substrate 42 portion of FIG. 4 has three substrate regions 10 attached to a surface thereof. Bond regions 44 are formed on the surface of the primary substrate 42, and positioned to make contact with the openings 12 which are connected to conductive traces 16. To attach the substrates 10 to the primary substrate 42, solder bumps are screened onto the bond regions 44, and the substrates 10 bonded thereto. The conductive solder at the bond regions 44 causes the respective bond regions to be connected to the integrated circuit devices 18 through corresponding conductive traces 16 and bond pads 14. Primary substrate 42 can be a typical printed circuit board as known in the art, with electrical connections therebetween being made as known.

Figure 5:
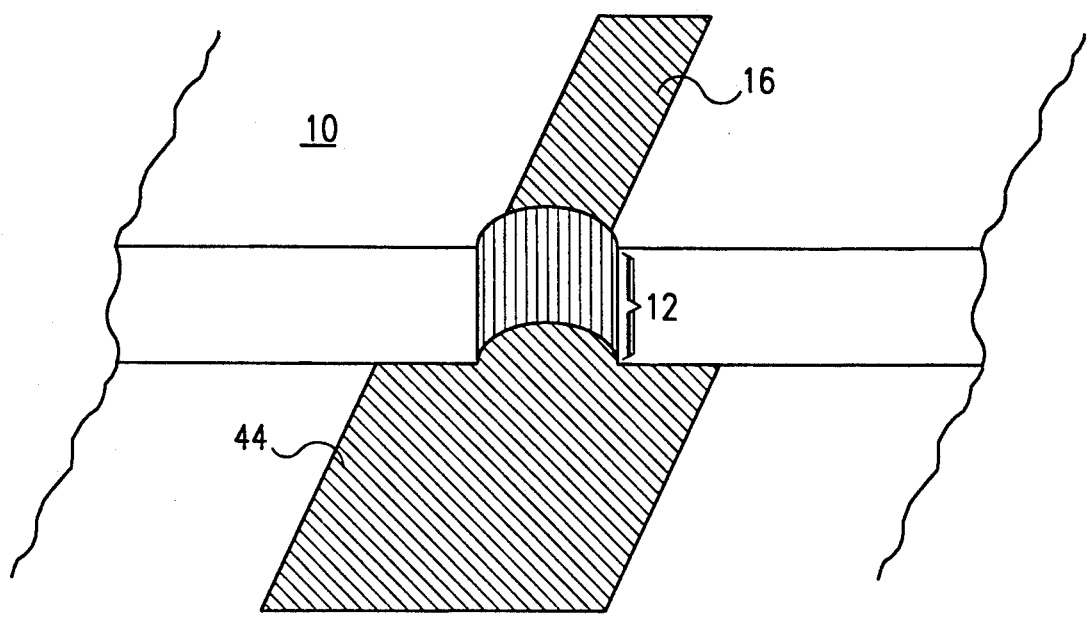
FIG. 5 illustrates details of the connection between the test substrates and the printed circuit boards.

Referring to FIG. 5, detail is shown of a single connection between a conductive trace 16 on an upper surface of a substrate region 10, and a bond region 44. Conductive plating lines the inside of through hole 12. The conductive solder (not shown) will connect to both the bond region 44 and the inside of the opening 12, making a good electrical connection. Although an underside conductive trace 26 (not shown in FIG. 5), will also contact the bond region 44, it is not connected to anything on the other end. This is a result of the use of alternate openings 12 as shown in FIG. 1.

The technique described herein allows an inexpensive, disposable test substrate 22 to be used. The substrate regions 10 remain with the integrated circuits 18 which were attached during test and burn-in. Subsequent handling of the unpackaged integrated circuit devices 18 is done by handling the substrate 10, minimizing the chances of damaging the devices 18. The net effect of using the described techniques is that the burn-in fixture, substrate 22, is shipped as part of the final product.

The described technique allows a large number of integrated circuit devices to be burned-in in parallel, and easily isolated for test purposes. Although a 6×11 matrix is shown in FIG. 3, the substrate 22 can be any desired size. Regardless of the number of devices on the substrate 22, only a single socket of a burn-in tester is required to make contact with connecting pads 40.

While the invention has been particularly shown and described with reference to a preferred embodiment, it will be understood by those skilled in the art that various changes in form and detail may be made therein without departing from the spirit and scope of the invention.

What is claimed is:

1. A method for testing integrated circuit devices, comprising the steps of:
   attaching a plurality of integrated circuit dice, containing a desired plurality of devices, to an insulating substrate having conductive traces on an upper surface and a lower surface thereof,
   wherein said insulating substrate is divided into a plurality of regions defined by multiple lines of conductive through holes therethrough,
   and wherein said conductive traces on said upper surface are electrically connected to said conductive traces on said lower surface through said through holes;
   wire bonding to connect bonding wires from conductive bond pads on said integrated circuit dice to corresponding bonding locations on said traces on said upper surface;
   providing electrical power and signals to said integrated circuit dice through said conductive traces on said lower surface, wherein the signals are connected to said integrated circuit dice through said through holes, said conductive traces on said upper surface, and said bonding wires, for at least a predetermined burn-in period;
   physically breaking said conductive traces to at least partially isolate said integrated circuit dice; and
   testing said integrated circuit dice.

2. The method of claim 1, further comprising the steps of:
   before said electrical power providing step, applying a protective covering over the integrated circuit dice.

3. The method of claim 1, further comprising the steps of:
   after said testing step, breaking the substrate along the linear series of through holes separating the substrate regions to provide a plurality of secondary substrates each containing one integrated circuit die.

4. The method of claim 1, wherein said insulating substrate consists essentially of alumina.

5. The method of claim 1, wherein said attaching step uses epoxy.

6. A method of testing integrated circuits, comprising the steps of:
   affixing individual integrated circuits to respective portions of a breakable insulating substrate having conductive traces thereon;
   wire-bonding electrical contact pads of each of said integrated circuits to respective ones of said traces;
   burning-in said integrated circuits while supplying power through said traces;
   physically severing at least some ones of said traces, to at least partially isolate said integrated circuits;
   electrically testing said integrated circuits;
   breaking apart said insulating substrate, to sever said traces and provide multiple fragments having respective ones of said integrated circuits thereon; and
   packaging at least some ones of said integrated circuits with respective fragments of said insulating substrate still adhered thereto.

7. The method of claim 6, wherein said insulating substrate consists essentially of alumina.

8. The method of claim 6, wherein said affixing step uses epoxy.

9. The method of claim 6, further comprising the additional step of encapsulating said integrated circuit on said substrate, after said step of electrically testing.

10. The method of claim 6, further comprising the subsequent step of affixing said fragments of said substrate to a respective primary substrate.

11. A method of testing integrated circuits, comprising the steps of:
    affixing individual integrated circuits to respective portions of a breakable insulating substrate having conductive traces thereon, and conductive through-holes positioned to define breakage lines;
    wire-bonding electrical contact pads of each said integrated circuit to respective ones of said traces;
    burning-in said integrated circuits while supplying power through said traces;
    physically severing at least some ones of said traces, to at least partially isolate said integrated circuits;
    electrically testing said integrated circuits;
    breaking apart said insulating substrate, to sever said traces and provide multiple fragments having respective ones of said integrated circuits thereon; and
    forming electrical connections to said through-holes of said fragments, to thereby form electrical connections to said contact pads of said integrated circuits.

12. The method of claim 11, wherein said insulating substrate consists essentially of alumina.

13. The method of claim 11, wherein said affixing step uses epoxy.

14. The method of claim 11, further comprising the additional step of encapsulating said integrated circuit on said substrate, after said step of electrically testing.

15. The method of claim 11, further comprising the additional step, prior to said step of forming electrical connections, of affixing said fragments of said substrate to a respective primary substrate.

16. A method of testing integrated circuits, comprising the steps of:
    affixing individual integrated circuits to respective portions of a breakable insulating substrate having conductive traces thereon, and conductive through-holes positioned to define breakage lines;
    wire-bonding electrical contact pads of each said integrated circuit to respective ones of said traces;
    burning-in said integrated circuits while supplying power through said traces;
    breaking off an edge portion of said substrate to physically sever at least some ones of said traces, to at least partially isolate said integrated circuits;
    electrically testing said integrated circuits;
    breaking apart said insulating substrate, to sever said traces and provide multiple fragments having respective ones of said integrated circuits thereon; and
    forming electrical connections to said through-holes of said fragments, to thereby form electrical connections to said contact pads of said integrated circuits.

17. The method of claim 16, wherein said insulating substrate consists essentially of alumina.

18. The method of claim 16, wherein said affixing step uses epoxy.

19. The method of claim 16, further comprising the additional step of encapsulating said integrated circuit on said substrate, after said step of electrically testing.

20. The method of claim 16, further comprising the additional step, prior to said step of forming electrical connections, of affixing said fragments of said substrate to a respective primary substrate.

* * * * *